United States Patent [19]

Hofer et al.

[11] 4,134,801
[45] Jan. 16, 1979

[54] TERMINAL CONNECTIONS ON MICROCIRCUIT CHIPS

[75] Inventors: Franz Hofer; Gustaaf H. A. van der Hoorn, both of Eindhoven, Netherlands

[73] Assignee: U.S. Philips Corporation, New York, N.Y.

[21] Appl. No.: 895,711

[22] Filed: Apr. 12, 1978

Related U.S. Application Data

[63] Continuation of Ser. No. 795,729, May 11, 1977, abandoned.

[30] Foreign Application Priority Data

May 17, 1976 [NL] Netherlands ............ 7605233

[51] Int. Cl.² ............ C25D 5/02; C25D 5/48
[52] U.S. Cl. ............ 204/15; 204/16
[58] Field of Search ............ 204/15, 16, 40

[56] References Cited

U.S. PATENT DOCUMENTS 3,821,847  7/1974  Melse et al. ............ 204/15
3,926,746  12/1975  Hargis ............ 204/15

Primary Examiner—T. M. Tufariello
Attorney, Agent, or Firm—Thomas A. Briody; Steven R. Biren

[57] ABSTRACT

A method of manufacturing an elementary slice provided with a microcircuit and having terminal connections in the form of metallic bumps which ensure the connection of the microcircuit to external circuitry. A major slice is provided in which a number of elementary slices are formed which adjoin each other along future severing lines. Lands are provided on which to grow metallic bumps. In order to be able to electrolytically grow the metallic bumps on the lands, the latter are series-connected together and to a voltage source by conductive strips which extend in a zig-zag manner over the severing lines. After the growth process the electric connections between the lands are automatically interrupted when the slice is severed into elementary slices. The most important application of the invention lies in the field of manufacturing elementary slices with bubble domain handling structures.

4 Claims, 2 Drawing Figures

TERMINAL CONNECTIONS ON MICROCIRCUIT CHIPS

This is a continuation of application Ser. No. 795,729, filed May 11, 1977, now abandoned.

The invention relates to a method of manufacturing an elementary slice provided with a micro circuit and having a system of conductor tracks which leads from the microcircuit to at least one of the edges of the elementary slice and is provided there with a number of terminal connections, wherein a major slice is provided in which a number of elementary slices which are arranged in a regular pattern and which adjoin each other along future severing lines are formed and wherein on each elementary slice a number of terminal connections in the form of metallic bumps deposited on lands are provided near at least one future severing line.

Methods of this kind are of importance inter alia in the manufacture of elementary slices provided with microcircuits (so-called "Chips"), microcircuits being in this connection understood to mean e.g. semiconductor circuits, magnetic bubble domain handling structures and arrays of thin-film magnetic heads, which are to be provided with terminal connections for connection to external circuitry.

In order to produce a large number of connections in one operation and in the stablest possible manner, it is known from semiconductor technology to use a so-called "flip chip" method. This method involves in the provision of metallic bumps (so called "solder bumps") on a chip; the chip being then inverted and connected via the metallic bumps to a system of conductors which is provided on a support and which ensures connection to external circuitry.

In this method known from semiconductor technology it is usual first to provide the required conductor tracks on a major slice, then to sputter a quartz covering layer, to make holes in said layer at positions ("lands") where terminal connections are desired, then to vapor-deposit on the quartz layer a conductive auxiliary layer which contacts the lands via the holes, to provide a photoresist mask with apertures in line with the lands and then to deposite metallic bumps on said lands in a solution which contains metal salts. After completion, the conductive layer, which during the deposition ensured the electric connection between the lands, must be removed by etching so as to electrically separate the grown metallic bumps from each other, after which the major slice is severed into elementary slices. Thus the number of process steps is very large in the known method.

It is an object of the present invention to provide a method of manufacturing elementary slices with metallic bump terminal connections in which the number of proces steps is reduced and in which a particular the etching step is avoided which is necessary in the known method to remove the conductive auxiliary layer. The conventional etching step is not favored because it might adversely influence the already formed microcircuits.

For that purpose the method according to the invention is characterized in that there is provided on each elementary slice a conductive strip which series-connects lands situated adjoining a common severing line and passes at least twice said severing line between every two successive lands and is free from intersections, wherein at least one of the lands can be connected to a voltage source; that the side of the major slice on which the lands are provided is masked by means of an insulating layer which exposes the lands; that metallic bumps are deposited on the lands and that the major slice is then severed along the severing lines into a number of elementary slices so as to interrupt the electric connection between the lands.

The advantage of the method according to the invention resides in the fact that the vapor deposition of a conductive auxiliary layer covering the whole surface for the electrolytic growth of the metallic bumps is not necessary since a special conductor pattern consisting of (zig-zig-shaped) conductive strips is provided which electrically connects the lands together. This pattern can be provided on the major slice sumultanoously with the lands and the conductor tracks and need not be removed by means of etching because, since the conductive strip extends over the severing lines in a "zig-zag" manner, the electrical connections between the lands are interrupted automatically during the severing via the severing lines of the major slice into elementary slices "zig-zig" is to be nnderstood to mean in particular a pattern which connects each land on a given elementary slice to two adjoining lands on an adjoining elementary slice).

In order to enable an easy connection to a voltage source, of the lands of the elementary slices formed in the major slice, an embodiment of the method according to the invention is characterized in that the elementary slices may be arranged in rows and columns, while per row and per column, respectively, the lands of adjoining elementary slices are provided in line and the conductive strips connecting them are connected together.

In this case it is possible to connect the lands per row and per column, respectively, to a conductor which is provided at the edge of the major slice and can be connected to a voltage source. If desired, said conductor may alternatively be formed by a part of the clamping device with which the major slice is held when being arranged in an electrolytic bath. In the case where the process for depositing the metallic bumps is an electrolytic growth process, then in order to ensure during the electrolytic growth process that the current distribution over the major slice is as uniform as possible and hence that the formed metallic bumps have a uniform height, a further embodiment of the method according to the invention is characterized in that in defined places of the major slice contact pads are provided for direct connection to a voltage source, which contact pads are connected to the lands.

When the major slice is severed into elementary slices (which may be carried out, for example, via scratching, fracturing, sawing, etching or by means of a laser beam) it is advantageous if the severing operation need not take place from the side on which the conductive strip pattern is provided but may start on the oppositely located side. For that purpose, a further embodiment of the method according to the invention is characterized in that the major slice may be formed from a transparent material and that severing into elementary slices takes place via severing lines on the side of the major slice opposite to the side where the lands are provided.

Major slices of a transparent material in the form of substrates of synthetic garnet material, for example gadolinium-gallium-garnet used in particular in the manufacture of magnetic bubble domain systems.

Although the method according to the invention may be used in the manufacture of several types of "microcircuit chips", the most important application lies in the field of the manufacture of elementary slices with bubble domain handling structures ("magnetic bubble chips"). In particular in this case it is possible to form not only the conductor tracks, the linear conductors and the lands but also the bubble handling structure from one and the same material which is provided in one process step.

Therefore, according to the invention there is also provided a method of manufacturing an elementary magnetic bubble slice which is provided with a bubble handling structure and with a system of conductor tracks which extends therefrom to at least one edge of the slice and which is provided near said at least one edge with a number of terminal connections for the connection to external circuitry, a non-magnetic substrate being provided on which an anisotropic magnetic layer in which magnetic bubble can be maintained is grown, a layer of electrically conductive, magnetizable material being provided on top of the magnetic layer, which method is characterized in that bubble domain handling structures for a number of elementary bubble slices adjoining each other along future severing lines of a major slice are formed from the magnetizable electrically conductive layer simultaneously with conductor tracks and lands by etching wherein on each elementary bubble slice near at least one future severing line a number of lands are formed which are connected in series by means of a conductive strip which passes said at least one severing line at least twice between two successive lands and is free from intersections, wherein at least one of the lands can be connected to a voltage source, that the electrically conductive layer is then masked by means of an insulating layer which exposes the lands; that metallic bumps are grown electrolytically on the lands and that severing into a number of elementary bubble slices takes place while interrupting the electrical connections between the lands.

The invention furthermore provides a major slice manufactured while using the method according to the invention and an elementary slice obtained therefrom, as well as a hybrid circuit in which such an elementary slice is directly connected to a conductor system provided on a support via metallic bumps.

The invention will now be described in greater detail, by way of example, with reference to the drawing. In the drawing.

Figure 1:
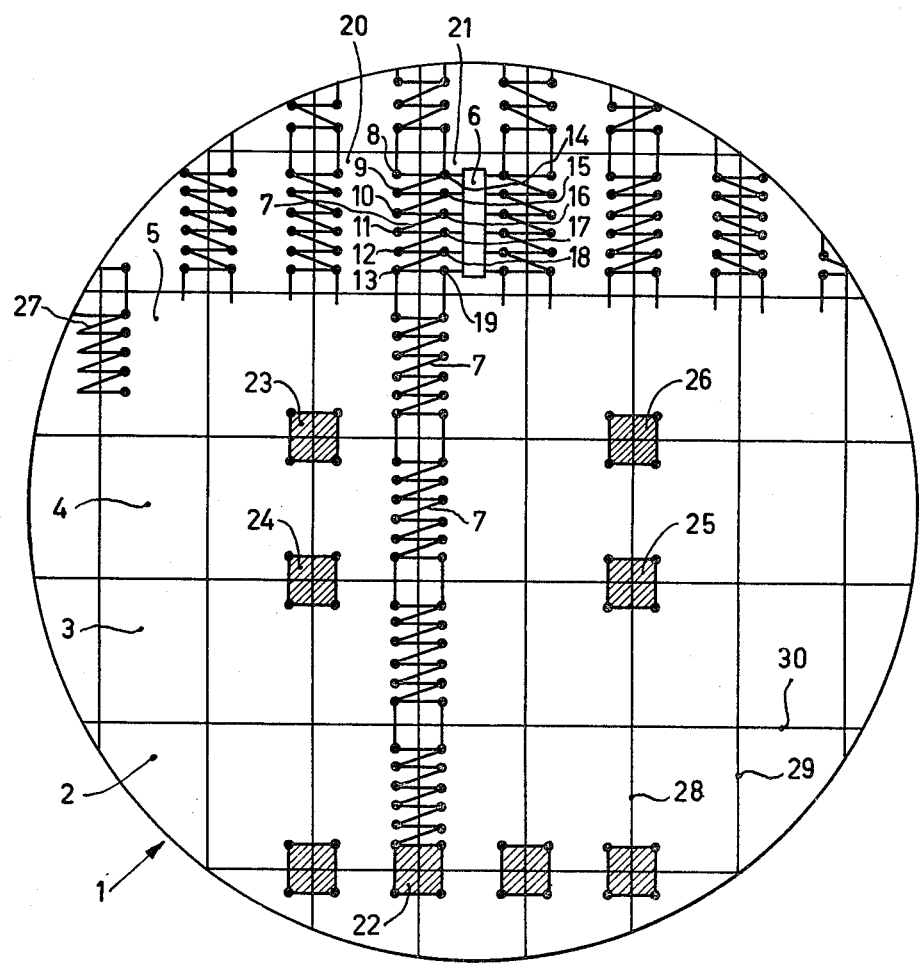
FIG. 1 is a plan view of a major slice which is to be divided into a number of elementary slices at a given stage of the method according to the invention.

FIG. 1 is a plan view of a major slice 1 in which a number of elementary slices 2, 3, 4, 5 and so on are formed. The elementary slices comprise microcircuits, one of which is shown by way of example and bears reference numeral 6. The following explanation is with reference to slices with magnetic bubble handling structures, but the explanation also applies to slices with semiconductor circuits and slices with arrays of thin-film magnetic heads. This means that in FIG. 1 microcircuit 6 is generic to a bubble handling structure, a semiconductor circuit, or an array of thin-film magnetic heads.

The manufacture of elementary magnetic bubble slices is known per se, see, for example, IEEE Transactions on Magnetics, Vol. Mag. 11, No. 5, September 1975 pp. 1157-1159, but the most important steps will be summarized below by way of typical example.

A major slice 1 is formed by a magnetic bubble layer (thickness: 6 microns, composition $(YSm)_3(GaFe)_5O_{12}$) grown on the (111) face of a gadolinium-gallium-garnet substrate having a diameter of 0.5 mm by means of liquid phase epitaxy, a quartz intermediate layer of 8000 Ångstrom being sputtered on the bubble layer. For the formation of a bubble handling structure, a layer of 80% Ni-20% Fe, thickness 4000 Ångstrom, is sputtered on the quartz-coated bubble layer. (If desired, first an adhering layer of 100 to 200 Ångstrom thickness of TiO may be sputtered on the quartz layer.) Via a photoresist make a pattern is formed in the Ni—Fe layer (by means of sputter etching) which pattern comprises per elementary slice a bubble domain handling structure, conductor tracks and lands for the terminal connections. (This will be explained in detail with reference to FIG. 2). Within the scope of the invention it is ensured that in addition a "zig-zig" conductive strip 7 connects the lands 8, 9, 10, 11, 12, 13 and 14, 15, 16, 17, 18, 19 of two adjoining elementary slices 20 and 21 both mutually and together. Similar "zig-zagging" strips are provided over all severing lines between adjoining elementary slices along which terminal connections are to be made. For clarity, however, they are not all shown in the figure. Through the strips the lands are connected together per column as is shown in FIG. 1. (Connection per row is also possible and when it is desired to make terminal connections along all four sides of an elementary slice it is possible to connect the strips together both per column and per row). At the edge of the major slice 1, special contact pads (as denoted by reference numeral 22) can be formed for the connection to an external voltage source during the deposition by electrolytic growth of metallic, terminal connections forming, bumps on the lands. Such special contact pads (for example, the contact pads 23, 24, 25 and 26) may also be formed in the center of the major slice 1 so as to ensure a uniform current distribution during the electrolytic growth process. Further it is also possible that a conductive strip "zig-zagging" over the severing line between two adjoining elementary slices connects only the lands on one of the elementary slices. See, for example, strip 27 on elementary slice 5.

A photo resist mask is then provided over the Ni—Fe layer which exposes the lands 8, 9, 10, 11, 12, 13 and 14, 15, 16, 17, 18, 19 and so on. The major slice 1 is then accommodated in a clamping member and placed in an electrolytic bath so as to enable the growth of metallic bumps on the lands. A eutectic $Pb_{40}$—$Sn_{60}$ solder bath may be used for the electrolytic bath. If desired, one or several intermediate layers are first provided.

The photoresist mask is then removed and the major slice 1 is severed into elementary slices 2, 3, 4, 5 and so on, for example, by scratching on the rear side in the desired places which denote the severing lines 28, 29, 30 and so on (it is of importance that the gadolinium, gallium-garnet substrate used be transparent), and performing the severing.

Figure 2:
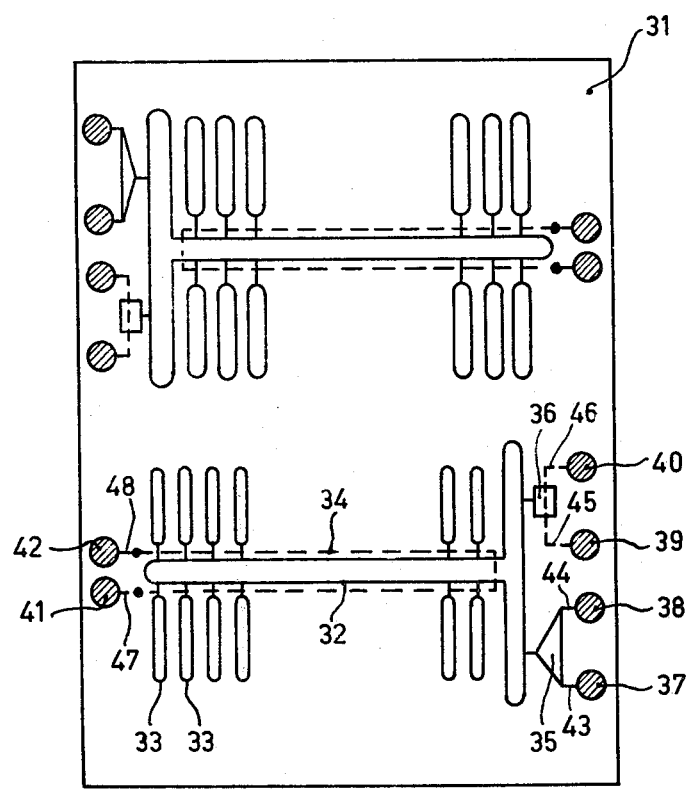
FIG. 2 is a diagrammatic plan view of an elementary chip with a structure for a magnetic bubble memory ("bubble memory chip").

FIG. 2 shows, by way of example, an elementary slice 31 obtained in the above-described manner and having a bubble handling structure which consists of two identical substructures and which is typical of the microcircuit 6 of FIG. 1. In this case the bubble handling substructures show a so-called major-minor loop organization with a major loop 32, minor loops 33, 33' and so on, a current joint 34, a detector 35 and a generator/annihilator 36. Solder bumps are grown on the lands 37, 38, 39, 40, 41, 42 for the connection of the slice to external circuitry.

It is to be noted that where reference is made above to bubble handling structures, structures are meant as shown in FIG. 2, that is to say combinations of major-minor loops, current joints, generators/annihilators, and the like. As is known, major-minor loops are formed, for example, by patterns of Ni—Fe in the form of so-called T-bars and I-bars. In the present case also the short conductor tracks 43, 44, 45, 46, 47, 48 which lead to the terminal connections 37, 38, 39, 40, 41, 42 are made of Ni—Fe.

What is claimed is:

1. A method of manufacturing an elementary magnetic bubble slice which has a bubble handling structure and a system of conductor tracks extending therefrom to at least one edge of the slice and which is provided near said at least one edge with a number of terminal connections for connection to external circuitry, which comprises providing a non-magnetic substrate on which an anisotropic magnetic layer in which magnetic bubble domains can be maintained is grown, providing a layer of electrically conductive, magnetizable material on top of the magnetic layer, forming bubble handling structures for a number of elementary bubble slices adjoining each other along severing lines of a major slice from the magnetizable, electrically conductive layer simultaneously with conductor tracks and lands, by etching in which on each elementary bubble slice on both sides of at least one severing line a number of connection points are formed which are series-connected in an alternating pattern by means of a conductive strip which crosses said severing line between two successive connection point on the same elementary slice at least twice and is free from intersections, at least one of the connection points being connectable to a voltage source, masking the said layer by means of an insulating layer which exposes the lands, growing metallic bumps electrolytically on the lands and then severing the major slice into a number of elementary bubble slices along said severing lines so as to interrupt the electrical connections between the lands.

2. A method of manufacturing an elementary magnetic bubble slice as claimed in claim 1, wherein the major slice is formed from a transparent material and the severing lines for severing the major slice are provided on the side of the major slice opposite to the side where the metallic bumps are grown.

3. A method as claimed in claim 1, wherein the conductor tracks, the conductive strip and the lands comprise the same electrically conductive material and are provided in a single process step.

4. An elementary magnetic bubble slice manufactured by the method of claim 1.

* * * * *